United States Patent [19]

Imaizumi et al.

[11] Patent Number: 5,329,250
[45] Date of Patent: Jul. 12, 1994

[54] DOUBLE PHASE LOCKED LOOP CIRCUIT

[75] Inventors: Hideo Imaizumi, Gunma; Yoshiaki Takahashi, Ohta, both of Japan

[73] Assignee: Sanyo Electric Co., Ltd., Osaka, Japan

[21] Appl. No.: 16,247

[22] Filed: Feb. 11, 1993

[30] Foreign Application Priority Data

Feb. 25, 1992 [JP] Japan .................. 4-037759
Jun. 26, 1992 [JP] Japan .................. 4-169184

[51] Int. Cl.$^5$ ........................... H03L 7/00
[52] U.S. Cl. ........................... 331/2; 331/11; 331/25
[58] Field of Search ............... 331/1, 2, 11, 25

[56] References Cited

U.S. PATENT DOCUMENTS

| | | | |
|---|---|---|---|
| 4,191,930 | 3/1980 | Harzer | 331/2 |
| 4,420,723 | 12/1983 | De Jagger | 331/2 |
| 4,438,412 | 3/1984 | Malinkowski et al. | 331/2 |
| 4,673,891 | 6/1987 | Remy | 331/2 |
| 4,839,603 | 6/1989 | Mower et al. | 331/2 |
| 4,912,432 | 3/1990 | Galani et al. | 331/2 |
| 4,943,787 | 7/1990 | Swapp | 331/2 |
| 4,963,838 | 10/1990 | Hareyama | 331/2 |
| 4,987,386 | 1/1991 | Poklemba et al. | 331/11 |
| 4,994,762 | 2/1991 | Tay | 331/2 |
| 5,075,639 | 12/1991 | Taya | 331/2 |
| 5,105,168 | 4/1992 | Da Silva | 331/2 |
| 5,157,355 | 10/1992 | Shikakura et al. | 331/11 |
| 5,194,828 | 3/1993 | Kato et al. | 331/2 |
| 5,208,555 | 5/1993 | Graham et al. | 331/11 |
| 5,235,290 | 8/1993 | Bar-David | 331/25 |
| 5,270,669 | 12/1993 | Jokura | 331/2 |

FOREIGN PATENT DOCUMENTS 2365258 4/1978 France ........................ 331/2
2-111124 4/1990 Japan .
91/07016 5/1991 PCT Int'l Appl. ............. 331/2

OTHER PUBLICATIONS

Tong, "Phase locked detector for double-sideband, diminished-carrier reception", Wireless World, vol. 87, No. 1548, Sep. 1981, pp. 79-83.

Sun, "A High Speed High Jitter Tolerant Clock And Data Recovery Circuit Using Crystal Based Dual PLL", IEEE 1991 Bipolar Circuits and Technology Meeting, pp. 293-296.

Dirndorfer et al., "Simulation und Aufbau eines experimentellen 140 Mbit/s–Binarsystems fur Koaxialkabel", Archiv Fur Elektronik Und Ubertragungstechnik, vol. 38, No. 2, Mar. 1984, pp. 79-84.

Fadrhons, "Blend a wideband PLL with a narrowband loop and boost frequency-synthesizer performance. The benefits: low noise, high resolution and low cost", Electron Design, vol. 24, No. 14, Jul. 5, 1976, pp. 46-51.

Primary Examiner—Raymond A. Nelli
Attorney, Agent, or Firm—Oliff & Berridge

[57] ABSTRACT

A frequency of a first VCO (12) for generating a carrier of a video IF signal is set by using a frequency of a second VCO (15) as reference. The oscillation frequency of the second VCO (15) is controlled in response to the phase difference between an output signal of the first VCO (12) and the video IF signal. As a result, the output signal phase of the first VCO (12) is adjusted, and the output signal is locked to a carrier frequency of the video IF signal. Thus, the oscillation frequency of the first VCO (12) can be set automatically. Further, a signal for the phase difference between the output signal of the first VCO (12) and the video IF signal is also applied to the first VCO (12), thereby improving the stability of circuit operation.

14 Claims, 6 Drawing Sheets

DOUBLE PHASE LOCKED LOOP CIRCUIT

BACKGROUND OF THE INVENTION

1. Field of the Invention

This invention relates to a PLL (phase locked loop) circuit which can be used with a synchronous detector circuit for detecting video signals in a television and more particularly to a PLL detector circuit which eliminates the need for adjustments to a resonator of a VCO (voltage controlled oscillator).

2. Description of the Related Art

Synchronous detection technology is indispensable to the communication and television fields. A PLL circuit is used to obtain continuous oscillation output synchronized with the frequency and phase of an input signal.

FIG. 1 shows an example of a conventional PLL circuit, wherein a phase comparator 101 consists of a multiplier and outputs a signal for the difference between two input signals. A loop filter 102 consists of a low pass filter and smooths the signal for the difference input from the phase comparator 101. A VCO (voltage controlled oscillator) 103 contains an LC oscillator, etc., for changing the oscillation frequency in response to the signal input from the loop filter 102. An input signal and a signal from the VCO 103 are input to the phase comparator 101. Thus, the PLL circuit operates so as to reduce the difference between the two signals input to the phase comparator 101; the output signal of the VCO 103 is synchronized with the input signal at the same frequency, and thus can be used for synchronous detection, etc.

FIG. 2 shows the characteristics of the PLL circuit, wherein the horizontal axis shows frequencies and the vertical axis shows output of the loop filter 102. Assume that f0 is a free running frequency of the VCO. The free running frequency refers to a frequency at which the VCO freely oscillates without being locked. Consider an input frequency that will be raised from the lower stage. First, the VCO 103 starts at a state in which it is not locked to input. At the f2 point, the loop enters a lock state. When the frequency is further raised, the loop is unlocked at the f4 point. Likewise, when the frequency is lowered from the upper stage, the loop enters a lock state at f3, then is unlocked at f1. The range between the lower and upper limits of frequencies, f2 and f3, where the loop not locked enters a lock state is referred to as a pull-in range. The range between the lower and upper limits of frequencies, f1 and f4, where the loop locked is unlocked is referred to as a hold range. Normally, these ranges are symmetrical with the free running frequency f0 as the shared center point of the two ranges.

Next, consider a phase error between input and VCO output in a stationary state. When the input signal frequency equals the free running frequency of the VCO, the phase error is zero. However, if the free running frequency shifts, the phase comparator supplies a voltage, thus a finite stationary phase error occurs. Assuming that ΔF is the free running frequency shift, that Kd is the phase comparator gain, and that Ko is the VCO control sensitivity, the stationary phase error Δθ is represented by the following expression:

$$\Delta\theta = \Delta F/(Kd \cdot Ko) \quad (1)$$

When the PLL circuit is used to make a synchronous detector for AM signal demodulation, the characteristics of detection output distortion, etc., deteriorate in proportion to the stationary phase error. Normally, LC tank circuits with large variations are often used to make VCOs. Therefore, in such systems, an adjustment is essential to minimize the VCO free running shift.

On the other hand, an LC resonator consisting of a coil and capacitor is often used as a VCO oscillator. However, since the LC resonator is low in Q (quality factor), oscillation frequency adjustment is required.

LC resonators must be adjusted one at a time on a manufacturing line of a factory and this adjustment step is cumbersome. The above-mentioned Q needs to be raised to accurately determine the center frequency; if it is raised, the pull-in range of the PLL circuit is narrowed, resulting in poor resistance to external noise. This is the only place in the PLL detector circuit block where an adjustment is necessary at present. A solution to this problem is desired.

SUMMARY OF THE INVENTION

Accordingly, it is an object of the invention to make an oscillation frequency of a VCO match an input signal frequency without narrowing a PLL pull-in range.

Another object of the invention is to automatically make the oscillation frequency of the VCO match the input signal frequency.

A further object of the invention is to make the automatic adjustment stably.

To these ends, according to a first embodiment of the invention, there is provided a PLL circuit which comprises a first VCO (voltage controlled oscillator) which oscillates at substantially the same frequency as an input signal; a first phase comparator which compares a phase of an oscillation output signal from the first VCO with a phase of the input signal and outputs a signal for a phase difference therebetween; a first loop filter for smoothing the output signal of the first phase comparator; a second VCO whose oscillation frequency is changed in response to an output signal of the first loop filter, the second VCO having a high frequency selectivity compared with the first VCO and oscillating at a frequency lower than the first VCO; a dividing circuit which divides the oscillation output signal of the first VCO for generating substantially the same low frequency signal as the second VCO; a second phase comparator which compares a phase of the dividing circuit with a phase of an oscillation output signal of the second VCO and outputs a signal for a phase difference therebetween; and a second loop filter for smoothing an output signal of the second phase comparator and feeding a signal to control the oscillation frequency of the first VCO into the first VCO, wherein the oscillation frequency of the first VCO is controlled in response to the signal from the second loop filter.

The output of the first loop filter is supplied to the second VCO rather than the first VCO. Thus, the oscillation frequency of the second VCO is controlled in response to the phase difference between the output signal of the first loop filter, namely, the input signal and the output signal of the first VCO. The output of the second VCO is input to the second phase comparator. Also supplied to the second phase comparator is a signal of the same frequency as the output of the second VCO provided by dividing the output of the first VCO. Thus, a signal for the phase difference between the two signals is output from the second phase comparator via the second loop filter to the first VCO so that the first VCO is controlled in response to the output of the second phase comparator.

The second VCO oscillates at a lower frequency than the first VCO. For example, when the oscillation frequency of the second VCO is set to an eighth the frequency of the input signal, even if the sensitivity of the PLL made up of the second phase comparator, the second loop filter, the first VCO, and the divider is made 24 kHz/mV, the sensitivity of the first phase comparator, the first loop filter, and the second VCO becomes 3 kHz/mV. Therefore,.the circuit becomes low in external sensitivity and high in internal sensitivity, so that it can be resistant to noise although the pull-in range for the input signal is made sufficiently large. Even if the pull-in range of the PLL made up of the second phase comparator, the second loop filter, the first VCO, and the divider is set to ±1.5 MHz the frequency variable range of the second VCO can be set to ±1.5/8=187.5 kHz.

Particularly, the oscillation frequency of the second VCO is controlled by the output of the first loop filter, thus input signals can be followed up securely. The first VCO uses an LC resonator and the second VCO uses a crystal oscillator so that the first and second VCOs can be made low and high respectively in frequency selectivity. The oscillation frequency of the second VCO is an eighth that of the first VCO and the dividing circuit divides the oscillation output signal of the first VCO by 8, thereby providing a predetermined sensitivity of the PLL.

The PLL circuit further comprises a detector circuit to which the input signal and the output signal from the first VCO are input for detecting the input signal; a first phase shifting circuit located between the first VCO and the first phase comparator for shifting a phase of an output signal from the first VCO; and a second phase shifting circuit located between the first VCO and the detector circuit for shifting a phase of an output signal from the first VCO.

The first phase shifting circuit shifts output of the first VCO 45 degrees for supplying to the first phase comparator a signal which has a phase difference of 90 degrees from the input signal and the second phase shifting circuit shifts output of the first VCO 45 degrees in a direction different from the first phase shifting circuit for supplying to the detector circuit a signal which has a phase difference of 180 degrees from the input signal.

The PLL circuit further comprises means for applying the output signal of the first loop filter to the first VCO.

The output of the first loop filter is applied to the first VCO, thereby improving stability of circuit operation.

To lock a PLL circuit, a negative feedback loop is required. The double PLL circuit of the invention becomes a biquadratic negative feedback loop. Unless the application means is provided, a root locus of a transfer function of the PLL circuit also exists on the right half of a complex plane, thus circuit operation becomes unstable.

The application means enables most of the root loci to be positioned on the left half of the complex plane, thus stabilizing circuit operation.

The application means is an adder for adding outputs of the first and second loop filters together.

The PLL circuit further includes a first multiplier (level adjusting means) located between the first loop filter and the adder for level adjusting the output signal of the first loop filter by a predetermined factor and a second level adjusting means located between the second loop filter and the adder for level adjusting the output signal of the second loop filter by a predetermined factor.

Thus, root loci can be made as desired for preferable circuit operation.

DESCRIPTION OF THE PREFERRED EMBODIMENTS

First embodiment

Figure 3:
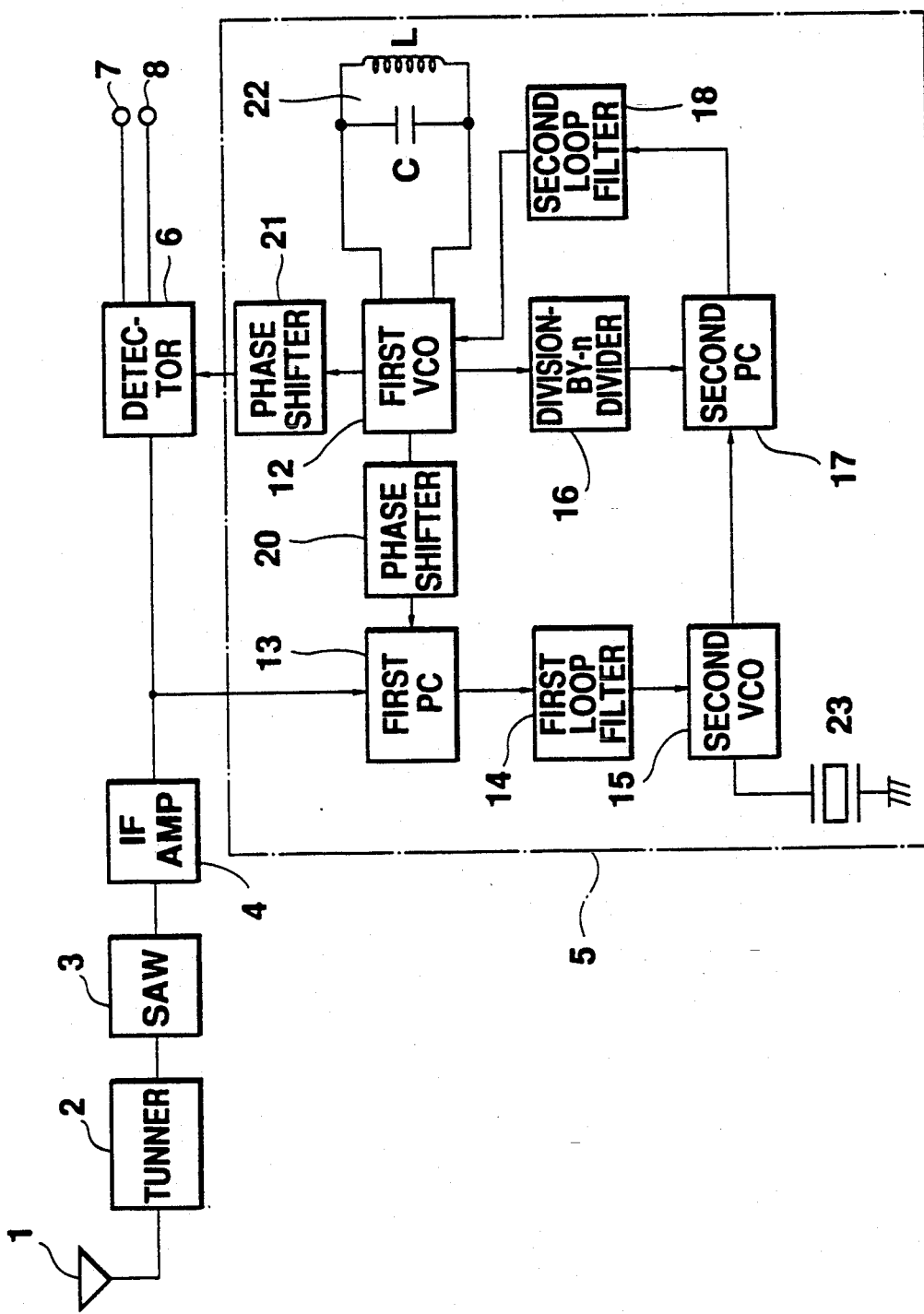
FIG. 3 is a block diagram showing a double PLL circuit according to a first embodiment of the invention.

FIG. 3 is a block diagram showing a video synchronous detector circuit using a PLL circuit, wherein an RF signal received through an antenna 1 is input to a tuner 2. The tuner 2 gives predetermined treatment to the input RF frequency for conversion to an IF signal. This IF signal is fed through a SAW filter 3 into an IF amplifier circuit 4 for amplification. An output of the IF amplifier 4 is fed into a PLL circuit 5 where a carrier is regenerated. The carrier regenerated by the PLL circuit 5 and the amplified IF signal are supplied to the detector circuit 6 which then uses the regenerated carrier to detect the IF signal.

In Japan, the video intermediate frequency is set to 58.75 MHz and the sound intermediate frequency to 54.25 MHz; when a video IF signal is detected by the detector 6, a video signal is output to a terminal 7 and a beat frequency of the sound and video intermediate frequencies namely, a 45 MHz SIF signal is output to a terminal 8.

The PLL circuit 5 is made up of the following: Numeral 12 is a first VCO which oscillates at the video IF signal frequency; numeral 13 is a first phase comparator which makes a phase comparison between the video IF signal and oscillation output signal the first VCO 12; numeral 14 is a first loop filter which smooths an output signal of the first phase comparator 13; numeral 15 is a second VCO which has a sufficiently high frequency selectivity compared with the first VCO 12 and whose oscillation frequency is controlled in response to an output signal of the first loop filter; numeral 16 is a division-by-n divider which divides the oscillation output signal of the first VCO 12 into n elements to make the frequency equal to the oscillation output signal frequency of the second VCO 12; numeral 17 is a second phase comparator which makes a phase comparison between the output signal of the divider 16 and an output signal of the second VCO; numeral 18 is a second loop filter which smooths an output signal of the second phase comparator 17; and numerals 20 and 21 are 45-degree phase shifter circuits.

An LC resonator 22 with low Q is used as a frequency selection element of the first VCO 12 and its frequency is set to the video IF signal frequency 58.75 MHz. A crystal oscillator 23, ceramic oscillator or the like with high Q is used as a frequency selection element of the second VCO 15 and its frequency is set to 58.75/n [MHz], The second phase comparator 17, the first VCO 12, the divider 16, and the second loop filter 18 make up the PLL circuit, and the frequency accuracy of the second VCO 15 is very high because the crystal oscillator 23 is used. As a result, the oscillation frequency of the first VCO 12 can become 58.75 MHz precisely as with the VCO 15 without any special adjustments. Since the video signal modulation system is AM, a synchronous detection system is used to detect the video signal. The synchronous detection system requires that the phase difference between a video IF signal from the IF amplifier circuit 4 and a carrier from the first VCO 12 should be set to 180 degrees precisely. Then, the first phase comparator 13 and the first loop filter 14 are provided in FIG. 3 for phase control of the second VCO 15. The phase control result is fed back into the first VCO 12 via the second phase comparator 17 and the second loop filter 18 for phase adjustment of the first VCO 12. This loop enables the phase relationship between two inputs of the first phase comparator 13 to become 90 degrees precisely, and adding the total phase angle 90 degrees of both phase shifting circuits 20 and 21 to the phase relationship can provide the phase relationship between two inputs of the detector circuit 6 of 180 degrees precisely. The output of the first VCO and the IF signal are 135 degrees apart as degrees out of phase, and the phase shifting circuits 20 and 21 shift each the phase 45 degrees in the opposite direction.

Therefore, the circuit shown in FIG. 3 enables the video signal to be detected without adjusting the VCO free running frequencies.

The pull-in range of the PLL circuit made up of the second phase comparator 17, the second loop filter 18, the first VCO 12, and the divider 16 shown in FIG. 3 requires approximately ±15 MHz, but the divider 16 enables the frequency variable range of the second VCO 15 to become ±1.5/n [MHz]. Assuming that n is 8, the frequency variable range of the second VCO 15 becomes 187.5 [kHz], which can be covered even by the crystal oscillator. If n is 8, the output signal frequency of the divider 16 becomes 7.34 MHz, that is, beyond the frequency band of the video signal (4.21 MHz), thus not adversely affecting the video signal after detection.

Figure 1:
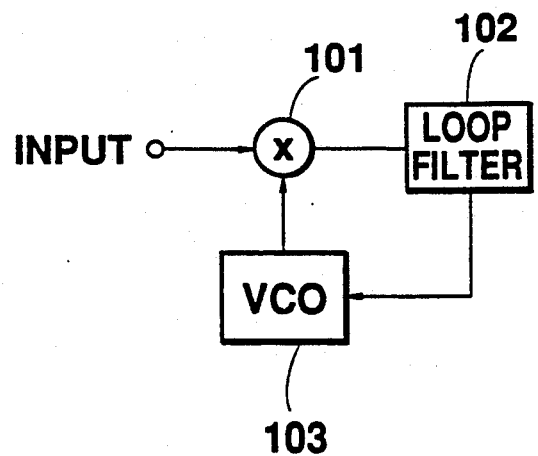
FIG. 1 is a block diagram showing a conventional PLL circuit.
Figure 2:
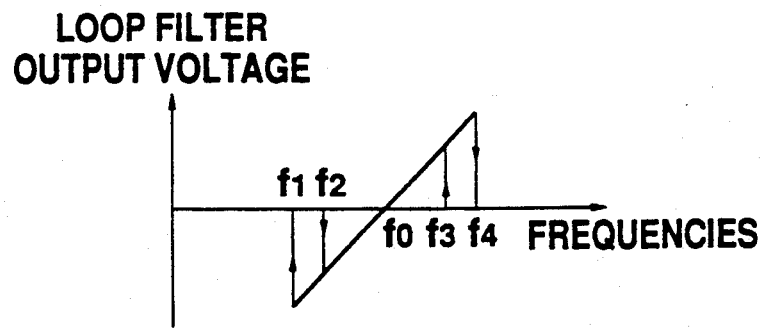
FIG. 2 is a characteristic chart of the PLL circuit shown in FIG. 1.

The pull-in range of the PLL circuit made up of the second phase comparator 17, the second loop filter 18, the first VCO 12, and the divider 16 shown in FIG. 3 must be enlarged compared with the PLL circuit in FIG. 1. If the initial setting is placed out of range, no adjustments can be made because it cannot be manually adjusted from the outside. To enlarge the pull-in range, the PLL circuit sensitivity (Hz/V) simply needs only to be raised, but this cannot be performed because resistance to noise will lower if the sensitivity is simply raised. In this case, the PLL circuit of the invention is provided with the division-by-n divider 16 to lower the sensitivity for external signals and raise it for internal signals. Assuming that the control sensitivity of the PLL circuit made up of the second phase comparator 17, the second loop filter 18, the first VCO 12, and the divider 16 is 24 kHz/mV, that of the PLL circuit made up of the first phase comparator 13, the first loop filter 14, and the second VCO 15 becomes 3 kHz/mV. The sensitivity can be reduced as desired according to the dividing ratio n.

Further, if the capacitance of the LC resonator 22, c, is made small to enlarge the frequency variable range of the first VCO 12, the variable capacity value in the first VCO 12 becomes relatively large, resulting in a large change in oscillation frequency with respect to the control voltage of the first VCO 12.

The phase shifting circuits 20 and 21 may be reduced to one 90-degree phase shifter Thus, the PLL circuit of the first embodiment eliminates the need for adjustments of the VCO free running frequencies. However, the PLL circuit of the first embodiment which has two loops becomes a biquadratic negative feedback loop and a problem of unstable operation arises.

In this case, according to a second embodiment of the invention, there is provided a PLL circuit to which stabilization means is added.

Second embodiment

Figure 4:
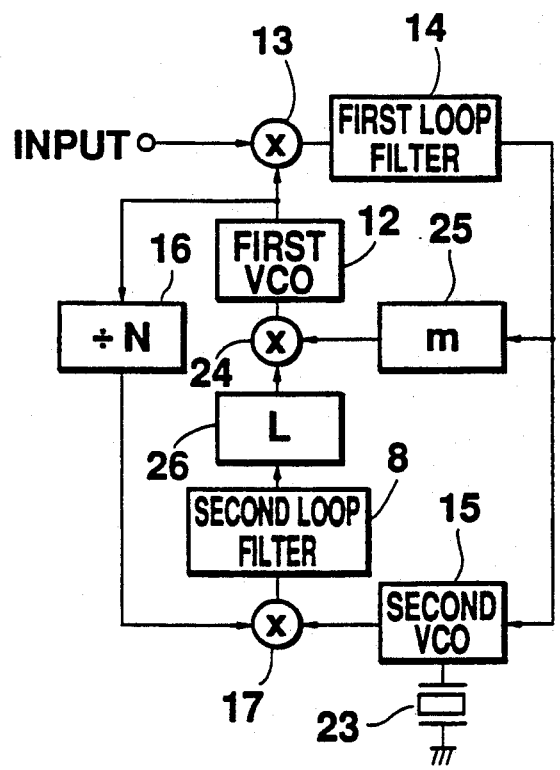
FIG. 4 is a circuit diagram showing a PLL detector circuit according to a second embodiment of the invention.

FIG. 4 is a block diagram showing a circuit according to the second embodiment of the invention, wherein numeral 24 is an adder; numeral 25 is a first multiplier which multiplies an output signal of a first loop filter 14 by a factor m; and numeral 26 is a second multiplier which multiplies an output signal of a second loop filter 18 by a factor L.

The corresponding circuit blocks to those shown in FIG. 3 are designated by the same reference numerals in FIG. 4, and are not discussed again.

Figure 5:
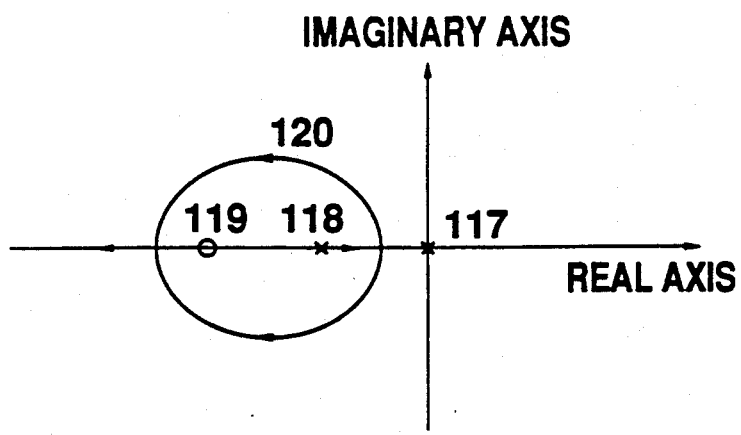
FIG. 5 is a chart showing a root locus of the PLL circuit shown in FIG. 1.
Figure 6:
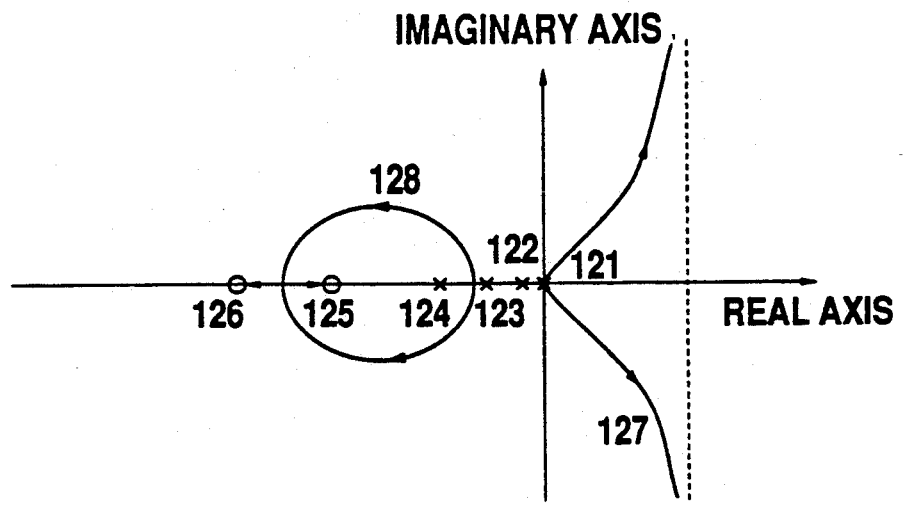
FIG. 6 is a chart showing root loci of the PLL circuit shown in FIG. 3.
Figure 7:
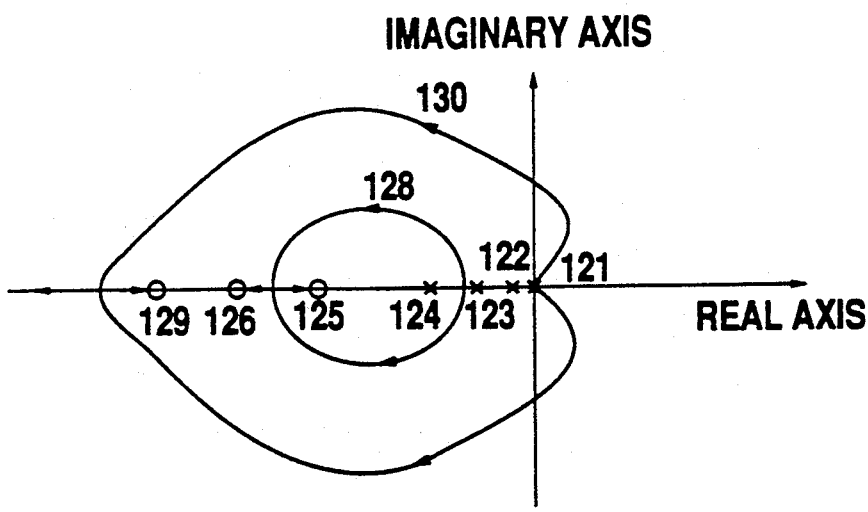
FIG. 7 is a chart showing root loci of the PLL circuit shown in FIG. 4.

How PLL loops are stabilized by the stabilization means of the invention of the invention is described in conjunction with FIGS. 5 to 7 in which three types of root loci of loop gains are shown as examples. FIG. 5 shows a root locus example for the conventional PLL circuit shown in FIG. 1. FIG. 6 shows a root locus example for the double PLL circuit shown in FIG. 3 with which no stabilization means is provided. FIG. 7 shows a root locus example for the double PLL circuit to which stabilization means is added.

The conventional PLL circuit with one loop shown in FIG. 1 has two loop gain poles and one zero point. In FIG. 5, numerals 117 and 118 denote the poles and 119 denotes the zero. Numeral 120 indicates a root locus drawn when the loop gain is changed from zero to infinity. The root locus starts at 117 and 118 and is separated into upper and lower parts at an intermediate point, then again returns to the real axis at the left of 119. If the root locus exists on the left half of the vector plane, the circuit is stable. Therefore, the example circuit is said to be stable.

Next, consider root loci of the double PLL circuit shown in FIG. 3. This example has four loop gain poles and two zeros. In FIG. 6, numerals 121, 122, 123, and 124 denote the roots and 125 and 126 denote the zeros. Root loci become as indicated by numerals 127 and 128, one of which is drawn on the right half of the vector plane. Therefore, the example circuit cannot be said to be stable.

In the embodiment, an output signal of the first loop filter 14 multiplied by a factor m and an output signal of the second loop filter 18 multiplied by a factor L are added together by the adder 24, then the result is added to a first VCO 12. If the loop filters 14 and 18 are made of lag lead filters, loop gain G in FIG. 4 becomes $$G = \frac{\frac{K_{PD1}K_{01}F_{1(s)}}{8S}\left(m + L\frac{K_{PD2}K_{02}}{S}F_{2(s)}\right)}{1 + L\frac{K_{PD2}K_{01}}{S}F_{2(s)}} \quad (2)$$

where $K_{PD1}$ is the gain of a phase comparator 13; $K_{PD2}$ is the gain of a phase comparator 17; $K_{01}$ is the control sensitivity of the first VCO 12; $K_{02}$ is the control sensitivity of a second VCO 15; S is a complex frequency; $F_{1(S)}$ is the transfer function of the first loop filter 14; and $F_{2(S)}$ is the transfer function of the second loop filter 14. Assuming that $K_{PD1}K_{01}=Ka$ $K_{PD2}K_{02}=Kb$, and $K_{PD2}K_{01}=Kc$ expression (2) is represented by $$G = \frac{\frac{K_aF_{1(s)}}{S}\left(m + LKb\frac{F_{2(s)}}{S}\right)}{1 + LK_c\frac{F_{2(s)}}{S}} \quad (3)$$

Figure 8:
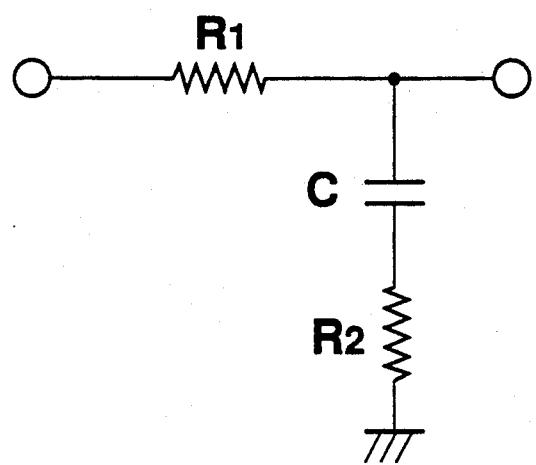
FIG. 8 is a specific circuit diagram of the loop filter shown in FIG. 4.

On the other hand, the first and second loop filters 14 and 18 are configured as shown in FIG. 8, and the transfer function thereof, $F_{(S)}$, is represented by $$F_{(s)} = \frac{(1 + ST_2)}{(1 + ST_1)} \quad (4)$$

where $T_1=C(R_1+R_2)$, $T_2=CR_2$. Assume that time constants of the first loop filter 14 are $T_{11}$ and $T_{12}$ and that time constants of the second loop filter 18 are $T_{21}$ and $T_{22}$. When the two transfer functions are assigned to expression (3), the gain G is represented by $$G = \frac{K_a(1 + ST_{12})\{mT_{21}S^2 + S(m + LKbT_{22}) + LKb\}}{S(1 + ST_{11})\{mT_{21}S^2 + S(1 + LK_cT_{22}) + LK_c\}} \quad (5)$$

FIG. 7 shows root loci after the stabilization means of the invention is provided. As compared with FIG. 6, the number and positions of roots are the same as those in FIG. 6, but one zero point is added as indicated by numeral 129. This additional zero point is provided by the stabilization means. Root loci become as indicated by numerals 128 and 130, the former of which is the same as the locus indicated by 128 in FIG. 6, but the latter differs greatly from the locus indicated by 127 in FIG. 6. The root locus on the right half plane in FIG. 6 is pulled back into the left half by means D of the added zero point 129 in FIG. 7. A slight part of the root locus remains in the right half plane in an area in which the loop gain is extremely small, but the major portion exists on the left half in a practical range; the example circuit is said to be stable.

Figure 9:
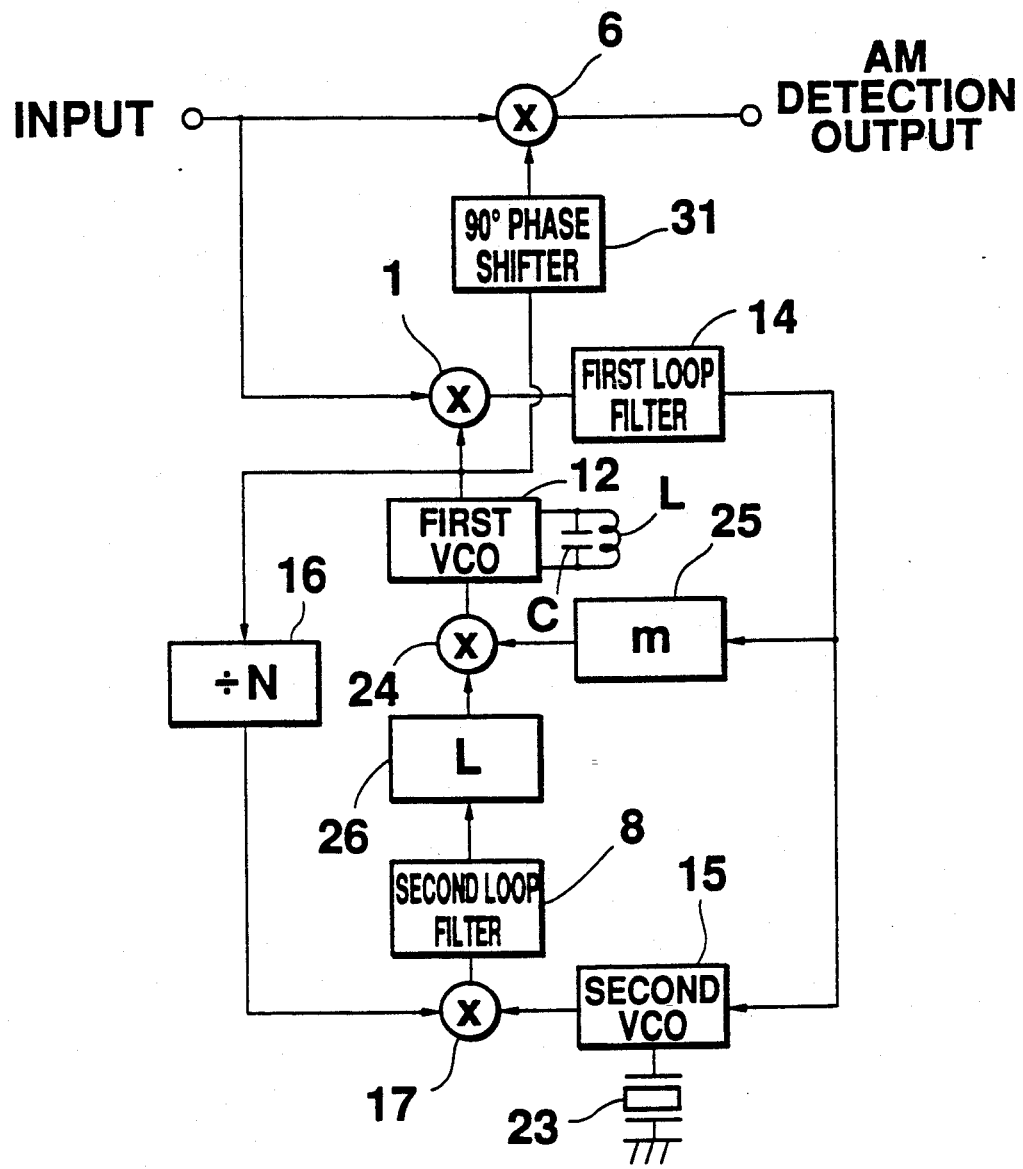
FIG. 9 is a block diagram for an AM synchronous detector circuit to which the invention is applied.

FIG. 9 is a block diagram for an AM synchronous detector circuit to which the invention is applied, wherein numeral 31 is a 90-degree phase shifter. The center frequency of a first VCO 12 is determined by a resonator circuit consisting of a capacitor C and a coil L and is automatically set by a second VCO 15 precisely and stably. Assuming that an input signal on a carrier is applied to an input terminal, a continuous signal synchronized with the carrier is generated from the first VCO 12. This continuous signal is phase-shifted by the 90-degree phase shifter 31 and is synchronized with the input signal, then applied to an AM detector 6. Thus, an AM detection output is provided by the AM detector 6.

What is claimed is:

1. A PLL circuit comprising:
    a first VCO (voltage controlled oscillator) which oscillates at substantially the same frequency as an input signal;
    a first phase comparator which compares a phase of an oscillation output signal from said first VCO with a phase of said input signal for outputting a signal for a phase difference therebetween;
    a first loop filter for smoothing the output signal of said first phase comparator;
    a second VCO whose oscillation frequency is changed in response to an output signal of said first loop filter, said second VCO having a high frequency selectivity compared with said first VCO and oscillating at a frequency lower than said first VCO;
    a dividing circuit which divides the oscillation output signal of said first VCO for generating substantially the same low frequency signal as said second VCO;
    a second phase comparator which compares a phase of said dividing circuit with a phase of an oscillation output signal of said second VCO for outputting a signal for a phase difference therebetween; and
    a second loop filter for smoothing an output signal of said second phase comparator and feeding a signal to control the oscillation frequency of said first VCO into said first VCO.

2. The PLL circuit as claimed in claim 1 wherein said first VCO uses an LC resonator and said second VCO uses a crystal oscillator.

3. The PLL circuit as claimed in claim 1 wherein the oscillation frequency of said second VCO is an eighth that of said first VCO and said dividing circuit divides the oscillation output signal of said first VCO by 8.

4. The PLL circuit as claimed in claim 1 further comprising:
    a detector circuit to which said input signal and the output signal from said first VCO are input for detecting said input signal;
    a first phase shifting circuit located between said first VCO and said first phase comparator for shifting a phase of an output signal from said first VCO; and
    a second phase shifting circuit located between said first VCO and said detector circuit for shifting a phase of an output signal from said first VCO.

5. The PLL circuit as claimed in claim 4 wherein said first phase shifting circuit shifts output of said first VCO 45 degrees for supplying to said first phase comparator a signal which has a phase difference of 90 degrees from said input signal and said second phase shifting circuit shifts output of said first VCO 45 degrees in a direction different from said first phase shifting circuit for supplying to said detector circuit a signal which has a phase difference of 180 degrees from said input signal.

6. The PLL circuit as claimed in claim 1, wherein said input signal is a video IF signal.

7. The PLL circuit as claimed in claim 1 further comprising means for applying the output signal of said first loop filter to said first VCO.

8. The PLL circuit as claimed in claim 7 wherein said signal application means is an adder for adding outputs of said first and second loop filters together.

9. The PLL circuit as claimed in claim 8 further including:
a first multiplier located between said first loop filter and said adder for multiplying the output signal of said first loop filter by a predetermined factor; and
a second multiplier located between said second loop filter and said adder for multiplying the output signal of said second loop filter by a predetermined factor.

10. The PLL circuit as claimed in claim 9 wherein said first VCO uses an LC resonator and said second VCO uses a crystal oscillator.

11. The PLL circuit as claimed in claim 9 wherein the oscillation frequency of said second VCO is an eighth that of said first VCO and said dividing circuit divides the oscillation output signal of said first VCO by 8.

12. The PLL circuit as claimed in claim 9 further comprising:
a detector circuit to which said input signal and the output signal from said first VCO are input for detecting said input signal; and
a phase circuit located between said first VCO and said detector circuit for shifting a phase of an output signal from said first VCO.

13. The PLL circuit as claimed in claim 12 wherein said phase shifting circuit shifts output of said first VCO 90 degrees for supplying to said detector circuit a signal which has a phase difference of 180 degrees from the input signal.

14. The PLL circuit as claimed in claim 12 wherein said signal is a video IF signal.

* * * * *